(12) United States Patent
Zhang et al.

(10) Patent No.: US 11,196,196 B2
(45) Date of Patent: Dec. 7, 2021

(54) CONNECTION APPARATUS, NETWORK BOARD CONNECTION SYSTEM, AND COMMUNICATIONS DEVICE

(71) Applicant: HUAWEI TECHNOLOGIES CO., LTD., Guangdong (CN)

(72) Inventors: Zhao Zhang, Shenzhen (CN); Yu Tian, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/705,530

(22) Filed: Dec. 6, 2019

(65) Prior Publication Data

US 2020/0112112 A1  Apr. 9, 2020

Related U.S. Application Data

(63) Continuation of application No. PCT/CN2018/090290, filed on Jun. 7, 2018.

(30) Foreign Application Priority Data

Jun. 9, 2017  (CN) .......................... 201710434542.3

(51) Int. Cl.
*H01R 12/70* (2011.01)
*H05K 5/02* (2006.01)
(Continued)

(52) U.S. Cl.
CPC ....... *H01R 12/7076* (2013.01); *H05K 5/0247* (2013.01); *H01R 12/52* (2013.01);
(Continued)

(58) Field of Classification Search
CPC .... H01R 12/716; H01R 12/73; H01R 12/721; H01R 12/7082; H01R 12/732;
(Continued)

(56) References Cited

U.S. PATENT DOCUMENTS 6,854,015 B2    2/2005  McCormack et al.
6,922,342 B2 *  7/2005  Doblar ...................... G06F 1/18
                                                361/736
(Continued)

FOREIGN PATENT DOCUMENTS

CN         2842776 Y    11/2006
CN       101355430 A     1/2009
(Continued)

OTHER PUBLICATIONS

Office Action dated May 6, 2020, issued in counterpart CN Application No. 201710434542 3, with English Translation (12 pages).

(Continued)

*Primary Examiner* — Abdullah A Riyami
*Assistant Examiner* — Justin M Kratt
(74) *Attorney, Agent, or Firm* — Westerman, Hattori, Daniels & Adrian, LLP

(57) ABSTRACT

A connection apparatus includes: a housing case, where the housing case includes a first side face and a second side face that are intersected and disposed adjacent to each other; a first connector, disposed on the first side face and configured to be connected to a connector of a first line card, so that the connection apparatus is orthogonally connected to the first line card; and a second connector, disposed on the second side face and connected to the first connector. The second connector is configured to be connected to a connector of a network board. The connection apparatus can improve a capacity of the communications device.

4 Claims, 8 Drawing Sheets

(51) Int. Cl.
  *H04Q 1/02* (2006.01)
  *H01R 12/73* (2011.01)
  *H01R 13/6587* (2011.01)
  *H01R 12/71* (2011.01)
  *H05K 1/14* (2006.01)
  *H01R 12/77* (2011.01)
  *H01R 12/62* (2011.01)
  *H01R 12/72* (2011.01)
  *H05K 3/36* (2006.01)
  *H01R 13/66* (2006.01)
  *H01R 12/79* (2011.01)
  *H01R 12/52* (2011.01)

(52) U.S. Cl.
  CPC .......... *H01R 12/62* (2013.01); *H01R 12/7082* (2013.01); *H01R 12/71* (2013.01); *H01R 12/712* (2013.01); *H01R 12/716* (2013.01); *H01R 12/72* (2013.01); *H01R 12/721* (2013.01); *H01R 12/722* (2013.01); *H01R 12/724* (2013.01); *H01R 12/73* (2013.01); *H01R 12/732* (2013.01); *H01R 12/735* (2013.01); *H01R 12/737* (2013.01); *H01R 12/771* (2013.01); *H01R 12/79* (2013.01); *H01R 13/6587* (2013.01); *H01R 13/6658* (2013.01); *H01R 2201/04* (2013.01); *H04Q 1/155* (2013.01); *H05K 1/14* (2013.01); *H05K 3/36* (2013.01)

(58) Field of Classification Search
  CPC .. H01R 13/6587; H01R 12/724; H01R 12/79; H01R 12/52; H01R 12/71; H01R 12/712; H01R 12/722; H01R 12/737; H01R 13/6658; H01R 12/62; H01R 12/72; H01R 12/735; H01R 12/771; H01R 2201/04; H01R 12/7076; H05K 1/14; H05K 1/142; H05K 3/36; H05K 5/0247; H04Q 1/155; G06F 13/4068
  USPC ...................................... 439/61, 65
  See application file for complete search history.

(56) References Cited

U.S. PATENT DOCUMENTS

| | | |
|---|---|---|
| 7,277,425 B1 | 10/2007 | Sikdar |
| 7,280,356 B2 | 10/2007 | Pfahnl et al. |
| 7,802,046 B2 | 9/2010 | Kowalski et al. |
| 9,136,624 B1 | 9/2015 | Reynov et al. |
| 2008/0112133 A1 | 5/2008 | Torudbakken et al. |
| 2010/0118867 A1 | 5/2010 | Zang et al. |
| 2014/0247826 A1 | 9/2014 | Ma |
| 2014/0273551 A1* | 9/2014 | Resendez ............. H01R 13/631 439/65 |
| 2014/0362546 A1 | 12/2014 | Sechrist et al. |
| 2016/0366072 A1 | 12/2016 | Goergen |
| 2019/0253777 A1 | 8/2019 | Yang |

FOREIGN PATENT DOCUMENTS

| | | |
|---|---|---|
| CN | 102983981 A | 3/2013 |
| CN | 103050800 A | 4/2013 |
| CN | 104064896 A | 9/2014 |
| CN | 104244654 A | 12/2014 |
| CN | 104641593 A | 5/2015 |
| CN | 105024189 A | 11/2015 |
| CN | 105281917 A | 1/2016 |
| CN | 106789753 A | 5/2017 |
| CN | 107239427 A | 10/2017 |
| EP | 3197112 B1 | 9/2019 |
| TW | I431489 B | 3/2014 |
| WO | 2010/090838 A2 | 8/2020 |

OTHER PUBLICATIONS

Office Action dated Jun, 4, 2019, issued in counterpart CN Application No. 201710434542.3, with English translation. (10 pages).
International Search Report dated Sep. 5, 2018, issued in counterpart Application No. PCT/CN2018/090290, with English translation. (13 pages).
Extended (Supplementary) European Search Report dated May 18, 2020, issued in counterpart application No. 18814063.6. (7 pages).

* cited by examiner

CONNECTION APPARATUS, NETWORK BOARD CONNECTION SYSTEM, AND COMMUNICATIONS DEVICE

CROSS-REFERENCE TO RELATED APPLICATIONS

This application is a continuation of International Application No. PCT/CN2018/090290, filed on Jun. 7, 2018, which claims priority to Chinese Patent Application No. 201710434542.3, filed on Jun. 9, 2017. The disclosures of the aforementioned applications are hereby incorporated by reference in their entireties.

TECHNICAL FIELD

The present invention relates to the field of communications technologies, and in particular, to a connection apparatus, a network board connection system, and a communications device.

BACKGROUND

A line card and a network board are disposed in a communications device such as a switch. The line card is configured to provide an interface for user equipment for use. The network board is used as a data switching unit and connected to different line cards, so that the different line cards exchange data with each other by using the network board. Currently, because a loss of data transmitted at a high rate on a link of a printed circuit board (PCB) is relatively large, a line card and a network board are usually connected by using an orthogonal connection architecture, to reduce a distance for transmitting data on the PCB board, and reduce a loss caused by data transmission.

The orthogonal connection architecture means that a line card and a network board are perpendicular to each other and connected to each other by using a connector. As shown in FIG. 1, a communications device includes M line cards 10 and N network boards 20. M connectors 21 are installed on a side on which each network board 20 is connected to the line cards 10. Each connector 21 is connected to a network board chip 22 on a network board 20 on which the connector 21 is located. N connectors 11 are installed on a side on which each line card 10 is connected to the network boards 20. Each connector 11 is connected to a line card chip 12 on a line card 10 on which the connector 11 is located. The M line cards 10 are orthogonally connected to the N network boards 20 by using the M connectors 21 and the N connectors 11.

It can be learned from a connection manner of the line cards and the network boards shown in FIG. 1 that a length of the network board greatly affects a quantity of line cards connected to the network board, and the quantity of line cards is a key factor that determines a capacity of the communications device. Rapid development of network technologies is accompanied with an increasingly higher requirement for a capacity of a communications device. However, due to limitation of a PCB board making standard, a length of a network board is also limited. Therefore, a quantity of line cards that can be connected to the network board is limited due to an orthogonal connection architecture of the network board and a line card, and the capacity of the communications device is difficult to improve.

SUMMARY

Embodiments of the present invention provide a connection apparatus, a network board connection system, and a communications device, to resolve a problem that a capacity of the communications device is difficult to improve.

According to a first aspect, an embodiment of the present invention provides a connection apparatus, including:

a housing case, where the housing case includes a first side face and a second side face that are intersected and disposed adjacent to each other;

a first connector, disposed on the first side face and configured to be connected to a connector of a first line card, so that the connection apparatus is orthogonally connected to the first line card; and a second connector, disposed on the second side face and connected to the first connector, where the second connector is configured to be connected to a connector of a network board.

With reference to the first aspect, in a first possible implementation of the first aspect, the second connector is movably connected to the second side face in a direction perpendicular to the second side face, to be disposed close to and away from the second side face.

With reference to the first aspect or the possible implementation, in a second possible implementation of the first aspect, when the connection apparatus is connected to the network board, the second connector is disposed away from the second side face.

With reference to the first aspect or the possible implementation, in a third possible implementation of the first aspect, a quantity of first connectors is the same as a quantity of second connectors.

With reference to the first aspect or the possible implementation, in a fourth possible implementation of the first aspect, connectors in the first connector are one-to-one connected to connectors in the second connector.

With reference to the first aspect or the possible implementation, in a fifth possible implementation of the first aspect, the first connector is connected to the second connector by using an optical cable or an electrical cable.

According to a second aspect, an embodiment of the present invention provides a network board connection system, including a network board and the connection apparatus according to the first aspect.

The network board includes a network board body, a network board chip disposed on the network board body, a third connector, and a fourth connector.

The third connector is disposed on a first network board side of the network board body and connected to the network board chip.

The fourth connector is disposed on a side adjacent to the first network board side of the network board body and connected to the network board chip.

The third connector is configured to be connected to a connector of a second line card, so that the network board is orthogonally connected to the second line card.

The fourth connector is connected to the second connector of the connection apparatus, so that the connection apparatus is connected to the network board.

When the connection apparatus is connected to the network board, a connection interface of the first connector and a connection interface of the third connector face a same direction.

With reference to the second aspect, in a first possible implementation of the second aspect, the first connector and the third connector are roughly aligned in a direction from the connection apparatus to the network board.

With reference to the second aspect or the possible implementation, in a second possible implementation of the second aspect, a quantity of second connectors is the same as a quantity of fourth connectors.

With reference to the second aspect or the possible implementation, in a third possible implementation of the second aspect, connectors in the second connector are one-to-one connected to connectors in the fourth connector.

According to the third aspect, an embodiment of the present invention provides a communications device, including a first line card, a second line card, and the network board connection system according to the second aspect.

The first line card includes a first line card body and a fifth connector disposed on a first line card body side of the first line card body.

The second line card includes a second line card body and a sixth connector disposed on a second line card body side of the second line card body.

The connection apparatus is connected to the first line card by using the first connector and the fifth connector, and the first line card body is perpendicular to the connection apparatus.

The network board is connected to the second line card by using the third connector and the sixth connector, and the first line card body is perpendicular to the network board body.

The first line card side and the second line card side are roughly parallel to each other.

With reference to the third aspect or the possible implementation, in a first possible implementation of the third aspect, the first network board side is roughly perpendicular to the second line card side.

The embodiments of the present invention provide a connection apparatus, a network board connection system, and a communications device. In this embodiment of the present invention, the connection apparatus includes a housing case. The housing case includes a first side face and a second side face that are intersected and disposed adjacent to each other. The first connector configured to be connected to the connector of the first line card is disposed on the first side face, so that the connection apparatus is orthogonally connected to the first line card. The second connector configured to be connected to the connector of the network board is disposed on the second side face. The first connector is connected to the second connector. In the embodiments of the present invention, the connection apparatus is connected to the connector of the network board by using the second connector, so that the connection apparatus is connected to the network board. In addition, the connection apparatus is orthogonally connected to the first line card by using the first connector. Therefore, it is equivalent to that the first line card connected to the connection apparatus is connected to the connector of the network board, in other words, connected to the network board. In this way, it is equivalent to that the connection apparatus increases a quantity of connectors connected to line cards in the network board, and may further increase a quantity of line cards orthogonally connected to each network board. In other words, when a length of a network board cannot be increased in the prior art, a quantity of connected line cards is increased by using the connection apparatus, and then a capacity of a communications device is improved.

BRIEF DESCRIPTION OF DRAWINGS

To describe the technical solutions in the embodiments of the present invention more clearly, the following briefly describes the accompanying drawings required for describing the embodiments of the present invention.

DESCRIPTION OF EMBODIMENTS

It should be noted that the embodiments in this application and features in the embodiments may be mutually combined provided that no conflict exists.

Figure 1:
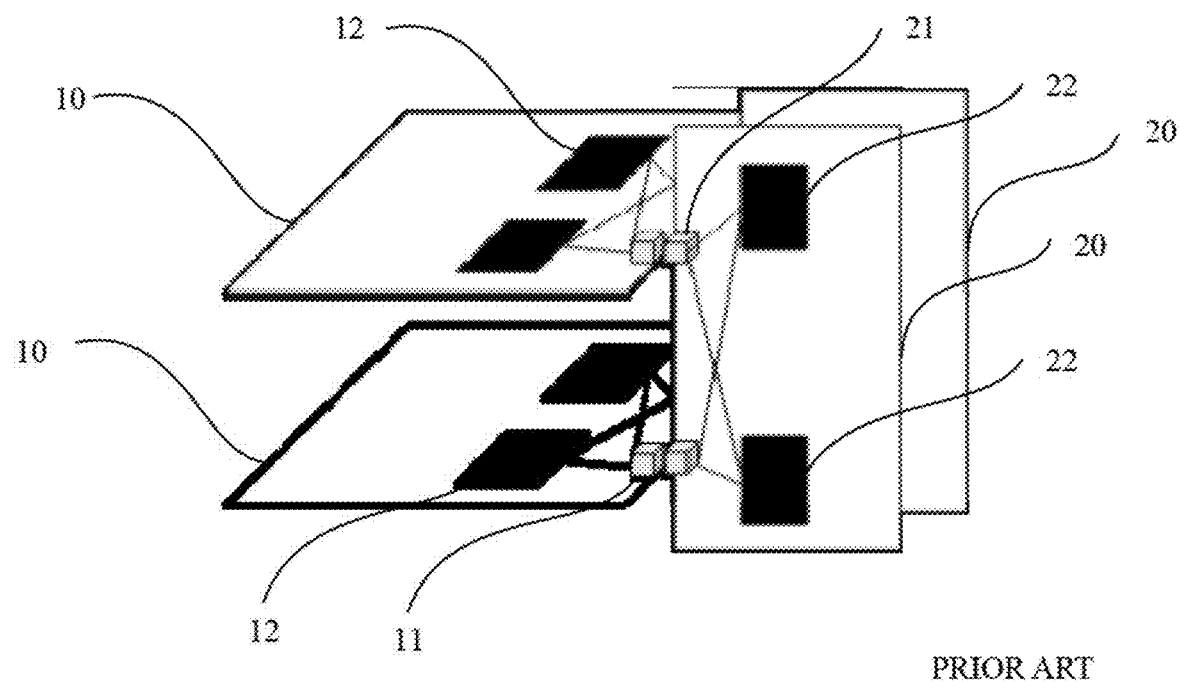
FIG. 1 is a schematic structural diagram in which a network board is orthogonally connected to a line card according to the prior art.
Figure 2:
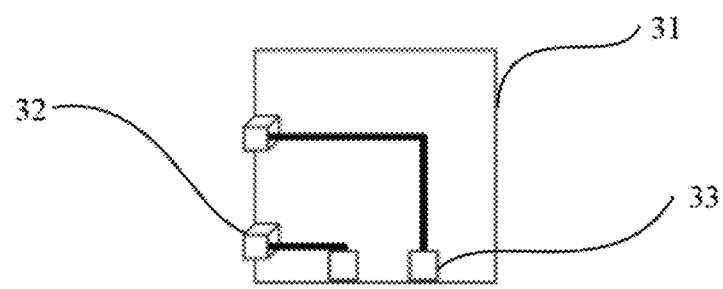
FIG. 2 is a schematic structural diagram of a connection apparatus according to an embodiment of the present invention.

An embodiment of the present invention provides a connection apparatus. FIG. 2 is a schematic structural diagram of a connection apparatus according to an embodiment of the present invention. As shown in FIG. 2, the connection apparatus includes a housing case 31, a first connector 32, and a second connector 33.

The housing case 31 includes a first side face and a second side face that are intersected and disposed adjacent to each other. The first connector 32 is disposed on the first side face and configured to be connected to a connector of a first line card, so that the connection apparatus is orthogonally connected to the first line card. The second connector 33 is disposed on the second side face and connected to the first connector 32. The second connector 33 is configured to be connected to a connector of a network board.

Specifically, the connection apparatus includes the housing case 31. As shown in FIG. 2, an example in which a structure of the housing case 31 is a cuboid is used for description. The housing case 31 includes two side faces that are intersected and adjacent to each other: the first side face and the second side face. The first connector 32 is disposed on the first side face, the second connector 33 is disposed on the second side face, and the first connector 32 is connected to the second connector 33. The first connector 32 is configured to be connected to the connector of the first line card, so that the connection apparatus can be orthogonally connected to the first line card. The second connector 33 is connected to the connector of the network board, so that the connection apparatus can be connected to the network board.

The connection apparatus is connected to the connector of the network board by using the second connector 33, so that the connection apparatus is connected to the network board. In addition, the connection apparatus is orthogonally connected to the first line card by using the first connector 32. Therefore, it is equivalent to that the first line card connected to the connection apparatus is connected to the connector of the network board, in other words, connected to the network board. In this way, it is equivalent to that the connection apparatus increases a quantity of connectors connected to line cards in the network board, and may further increase a quantity of line cards orthogonally connected to each network board. In other words, when a length of a network board cannot be increased in the prior art, a quantity of connected line cards is increased by using the connection apparatus, and then a capacity of a communications device is improved.

In addition, the network board is orthogonally connected to a line card, and the connection apparatus is also orthogonally connected to the first line card. Therefore, when the connection apparatus is connected to the network board, the first line card connected to the connection apparatus and the line card connected to the network board can be arranged in a same manner, and then respectively orthogonally connected to the connection apparatus and the network board, to increase a quantity of line cards connected to the network board and properly arrange the line card, the connection apparatus, and the network board, to reduce space occupied when the line card, the connection apparatus and the network board are interconnected to each other, and reduce a size of the communications device.

It should be noted that a quantity of connectors included in the first connector 32 and a quantity of connectors included in the second connector 33 are not limited in the embodiments of the present invention. When the first connector 32 includes at least two connectors, each connector is connected to a connector of a different line card in the first line card. When the first connector 32 and the second connector 33 both include at least two connectors, a connection manner of the first connector 32 and the second connector 33 may include that connectors in the first connector 32 are one-to-one connected to connectors in the second connector 33. As shown in FIG. 2, the first connector 32 includes two connectors, and the second connector 33 includes two connectors. When the first connector 32 is connected to the second connector 33, the two connectors in the first connector 32 are one-to-one connected to the two connectors in the second connector 33.

In this embodiment of the present invention, the first connector 32 may be connected to the second connector 33 by using an electrical cable or an optical cable. Because a loss of data transmitted at a high rate on a link of a PCB board is relatively large, in this embodiment of the present invention, the first connector 32 may be connected to the second connector 33 by using an electrical cable or an optical cable, to reduce a loss of data in a high-rate transmission process. The electrical cable or the optical cable connecting the first connector 32 and the second connector 33 may be placed in the housing case 31.

Figure 8:
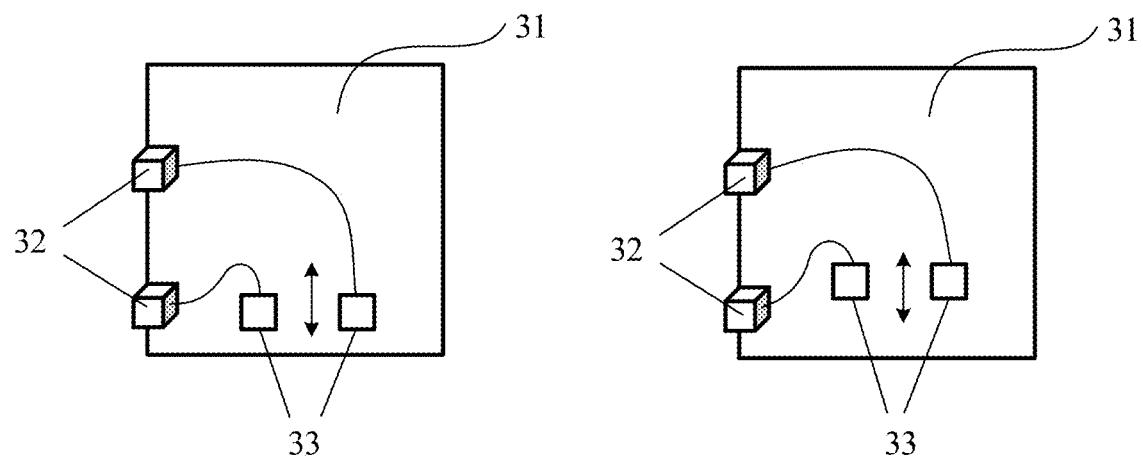
FIG. 8 is a schematic structural diagram of a connection apparatus according to an embodiment of the present invention, in which a second connector is movably connected to a second side face in a direction perpendicular to the second side face, to be disposed close to or away from the second side face.

In another embodiment of the present invention, as shown in FIG. 8, the second connector 33 is movably connected to the second side face in a direction perpendicular to the second side face, to be disposed close to and away from the second side face.

In this embodiment of the present invention, to facilitate connection and disconnection between the connection apparatus and the network board, the second connector 33 may be disposed as a movable connector. In other words, the second connector 33 disposed on the second side face may be movable. To be specific, the second connector 33 may be close to or away from the second side face in a direction perpendicular to the second side face.

In this way, connection and disconnection between the connection apparatus and the network board can be implemented by moving the second connector 33 without moving the connection apparatus or the network board, and this operation is simple and convenient and can further reduce plugging and unplugging forces that the network board bears.

Specifically, when the connection apparatus is connected to the network board, the second connector 33 is disposed away from the second side face. In other words, when the connection apparatus is connected to the network board, the second connector 33 is in a state of away from the second side face. When the connection apparatus and the network board need to be disconnected, the second connector 33 may be moved to a state of close to the second side face, to disconnect the connection apparatus and the network board.

When the movable second connector 33 is used to connect the network board and the connection apparatus, first, the network board and the connection apparatus may be moved to predetermined locations, and then, the second connector 33 is moved, so that the second connector 33 is away from the second side face and connected to a connector in the network board, to implement connection between the network board and the connection apparatus. If the network board and the connection apparatus need to be disconnected, the second connector 33 may be moved, so that the second connector 33 is close to the second side face and disconnected from the connector in the network board, to implement disconnection between the network board and the connection apparatus.

Figure 9:
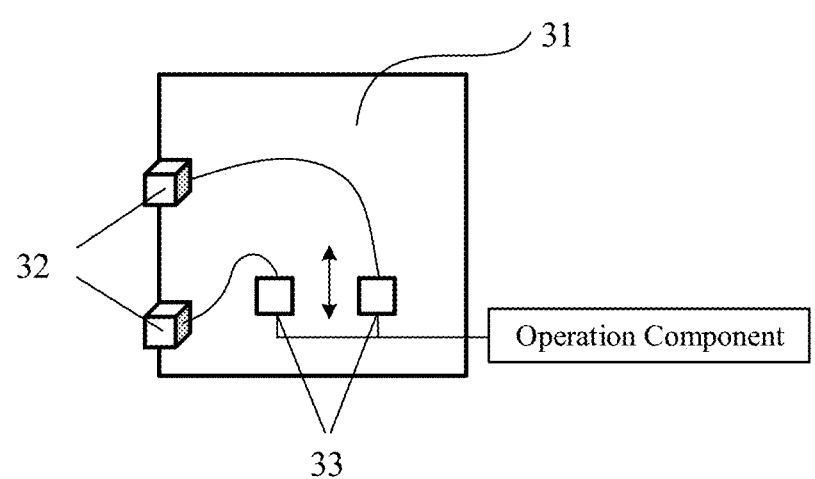
FIG. 9 is a schematic structural diagram of a connection apparatus according to an embodiment of the present invention, in which an operation component is connected to the second connector, and when the operation component is operated, the operation component drives the second connector to move.

In still another embodiment of the present invention, as shown in FIG. 9, the connection apparatus includes an operation component. The operation component is connected to the second connector 33. When the operation component is operated, the operation component may drive the second connector 33 to move.

To facilitate control of movement of the second connector 33, the connection apparatus may further include the operation component. The operation component is connected to the second connector 33, and movement of the second connector 33 may be controlled by operating the operation component.

Specifically, in this embodiment of the present invention, the operation component may specifically be a wrench.

It should be noted that, in this embodiment of the present invention, a disposition manner and a structure of the operation component are not limited, and a structure in which the movement of the second connector 33 is controlled by using the operation component is not limited.

In this embodiment of the present invention, an operation component may further be disposed on the connection apparatus to control plugging and unplugging of the connection apparatus and the first line card, to facilitate control of plugging and unplugging of the connection apparatus and the first line card. The connection apparatus may be plugged and unplugged in a direction of connection to the first line card, and may further be plugged and unplugged in a direction of connection to the network board. Therefore, the connection apparatus can be connected to the first line card and the network board through two-dimensional plugging and unplugging.

Figure 3:
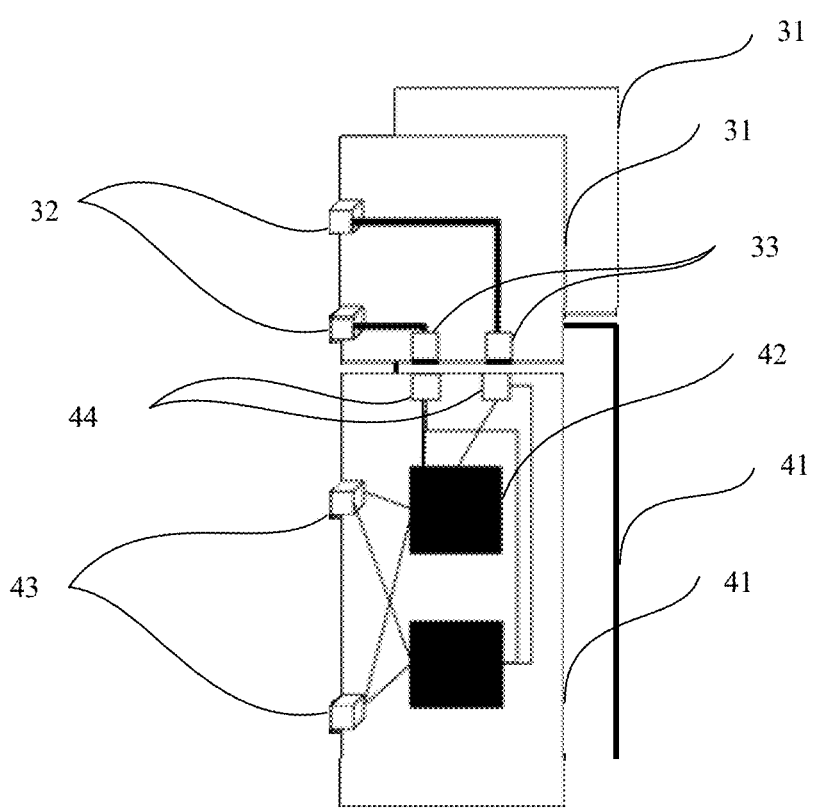
FIG. 3 is a schematic structural diagram of a network board connection system according to still another embodiment of the present invention.

Still another embodiment of the present invention provides a network board connection system. FIG. 3 is a schematic structural diagram of a network board connection system according to still another embodiment of the present invention. As shown in FIG. 3, the network board connection system includes a network board and the connection apparatus in the embodiment shown in FIG. 2.

The network board includes: a network board body 41, a network board chip 42 disposed on the network board body 41, a third connector 43, and a fourth connector 44. The third connector 43 is disposed on a first network board side of the network board body 41 and connected to the network board chip 42. The fourth connector 44 is disposed on a side adjacent to the first network board side of the network board body 41 and connected to the network board chip 42. The third connector 43 is configured to be connected to a connector of a second line card, so that the network board is orthogonally connected to the second line card. The fourth connector 44 is connected to the second connector 33 of the connection apparatus, so that the connection apparatus is connected to the network board. When the connection apparatus is connected to the network board, a connection interface of the first connector 32 and a connection interface of the third connector 43 face a same direction.

Specifically, as shown in FIG. 3, the third connector 43 connected to the second line card is disposed on the first network board side orthogonally connected to the second line card in the network board body 41, and the fourth connector 44 connected to the connection apparatus is disposed on the side adjacent to the first network board side of the network board body 41. The third connector 43 and the fourth connector 44 each are connected to the network board chip 42 on the network board body 41. The fourth connector 44 is connected to the second connector 33 of the connection apparatus, so that the connection apparatus is connected to the network board, and when the connection apparatus is connected to the network board, the connection interface of the first connector 32 and the connection interface of the third connector 43 face the same direction.

It should be noted that a communications device usually includes a plurality of network boards, and each network board may be connected to the connection apparatus to form a network board connection system. A structure in which one network board is connected to the connection apparatus is used as an example for description in this embodiment of the present invention.

Because the fourth connector 44 is connected to the network board chip 42, when the fourth connector 44 is connected to the second connector 33, the second connector 33 is also connected to the network board chip 42. The first connector 32 is connected to the second connector 33 in the connection apparatus. When the fourth connector 44 is connected to the second connector 33, the first connector 32 is also connected to the network board chip 42. In this case, the first line card connected to the connection apparatus is also connected to the network board chip 42, in other words, may exchange data with the second line card connected to the network board. Therefore, the first connector 32 of the connection apparatus may implement the same function as the third connector 43 in the network board. In other words, the line card is connected to the network board chip 42 and data is exchanged between the line cards. In this way, it is equivalent to that the connection apparatus increases a quantity of connectors connected to line cards in the network board, and may further increase a quantity of line cards orthogonally connected to each network board. In other words, when a length of a network board cannot be increased in the prior art, a quantity of connected line cards is increased by using the connection apparatus, and then a capacity of a communications device is improved.

It should be noted that, in this embodiment of the present invention, because the network board is connected to the connection apparatus, the connector connected to the second line card in the network board may be properly moved to the connection apparatus, to reduce a quantity of second line cards connected to the network board, and further reduce plugging and unplugging forces that the network board bears during plugging and unplugging of the line card.

In addition, the network board is orthogonally connected to the second line card, and the connection apparatus is also orthogonally connected to the first line card. When the connection apparatus is connected to the network board, the connection interface of the first connector 32 and the connection interface of the third connector 43 face the same direction. Therefore, the first line card and the second line card may be arranged in a same manner, so as to increase a quantity of line cards connected to the network board and properly arrange the line card, the connection apparatus, and the network board, to reduce space occupied when the line card, the connection apparatus and the network board are interconnected to each other, and reduce a size of the communications device.

It should be noted that, in this embodiment of the present invention, both the second connector 33 and the fourth connector 44 may include at least two connectors. A quantity of connectors in the second connector 33 may be the same as a quantity of connectors in the fourth connector 44. In this case, the connectors in the second connector 33 may be one-to-one connected to the connectors in the fourth connector 44. As shown in FIG. 3, the second connector 33 includes two connectors, and the fourth connector 44 includes two connectors. When the second connector 33 is connected to the fourth connector 44, the two connectors in the second connector 33 are one-to-one connected to the two connectors in the fourth connector 44.

In still another embodiment of the present invention, when the connection apparatus is connected to the network board, the first connector 32 and the third connector 43 are roughly aligned in a direction from the connection apparatus to the network board.

To make the first line card and the second line card more neatly arranged, when the connection apparatus is connected to the network board, the first connector 32 and the third connector 43 may be configured to be roughly aligned in a direction from the connection apparatus to the network board. As shown in FIG. 3, the first connector 32 and the third connector 43 are roughly aligned in a vertical direction from the connection apparatus to the network board.

It should be noted that there are two sides adjacent to the first network board side of the network board. In other words, the network board may be respectively connected to two connection apparatuses by using two sides adjacent to the first network board side. This embodiment shown in FIG. 3 only shows a schematic structure in which the network board is connected to one connection apparatus. A quantity of connection apparatuses connected to the network board is not limited in this embodiment of the present invention.

Figure 4:
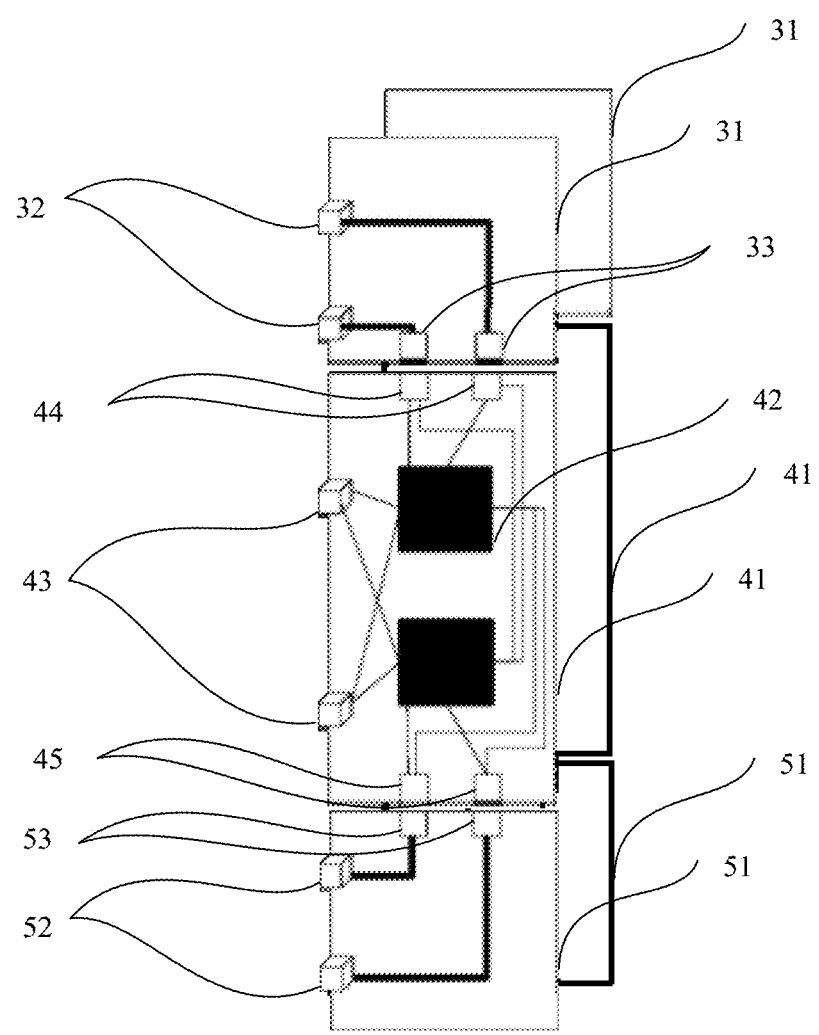
FIG. 4 is a schematic structural diagram of still another network board connection system according to still another embodiment of the present invention.

Specifically, FIG. 4 is a schematic structural diagram of still another network board connection system according to still another embodiment of the present invention. The communications device usually includes a plurality of network boards. In this embodiment of the present invention, as shown in FIG. 4, it is assumed that the communications device includes two network boards, and each network board is connected to two connection apparatuses. For ease of description, a network board located on a front side is referred to as a front side network board, and a network board located on a rear side is referred to as a rear side network board. Structures of two network boards are the same. A specific structure is described by using a structure in which the front side network board is connected to the two connection apparatuses. A connection apparatus connected to the front side network board includes a first connection apparatus located on an upper part of the front side network board and a second connection apparatus located on a lower part of the front side network board.

As shown in FIG. 4, the front side network board includes a network hoard body 41, a network board chip 42 disposed on the network board body 41, a third connector 43 configured to be connected to a second line card, a fourth connector 44 configured to be connected to the first connection apparatus, and a fourth connector 45 configured to be connected to the second connection apparatus. The third connector 43, the fourth connector 44 (for connecting to the first connection apparatus), and the fourth connector 45 (for connecting to the second connection apparatus) each are connected to the network board chip 42.

The first connection apparatus includes a housing case 31, a second connector 33 connected to the fourth connector 44, and a first connector 32 connected to a first line card. The first connector 32 is connected to the second connector 33.

The second connection apparatus includes a housing case 51, a second connector 53 connected to the fourth connector 45, and a first connector 52 connected to a first line card. The first connector 52 is connected to the second connector 53.

It should be noted that both structures of the first connection apparatus and the second connection apparatus are the same as the structures of the connection apparatus shown in FIG. 2. Manners in which the first connection apparatus and the second connection apparatus each are connected to the front side network board are the same as the manner in which the connection apparatus is connected to the network board shown in FIG. 3. For details, refer to description of the network board and the connection apparatus in the foregoing embodiment. Details are not described again.

Another embodiment of the present invention further provides a communications device, including a first line card, a second line card, and the network board connection system in the embodiment shown in FIG. 3 or FIG. 4.

Figure 5:
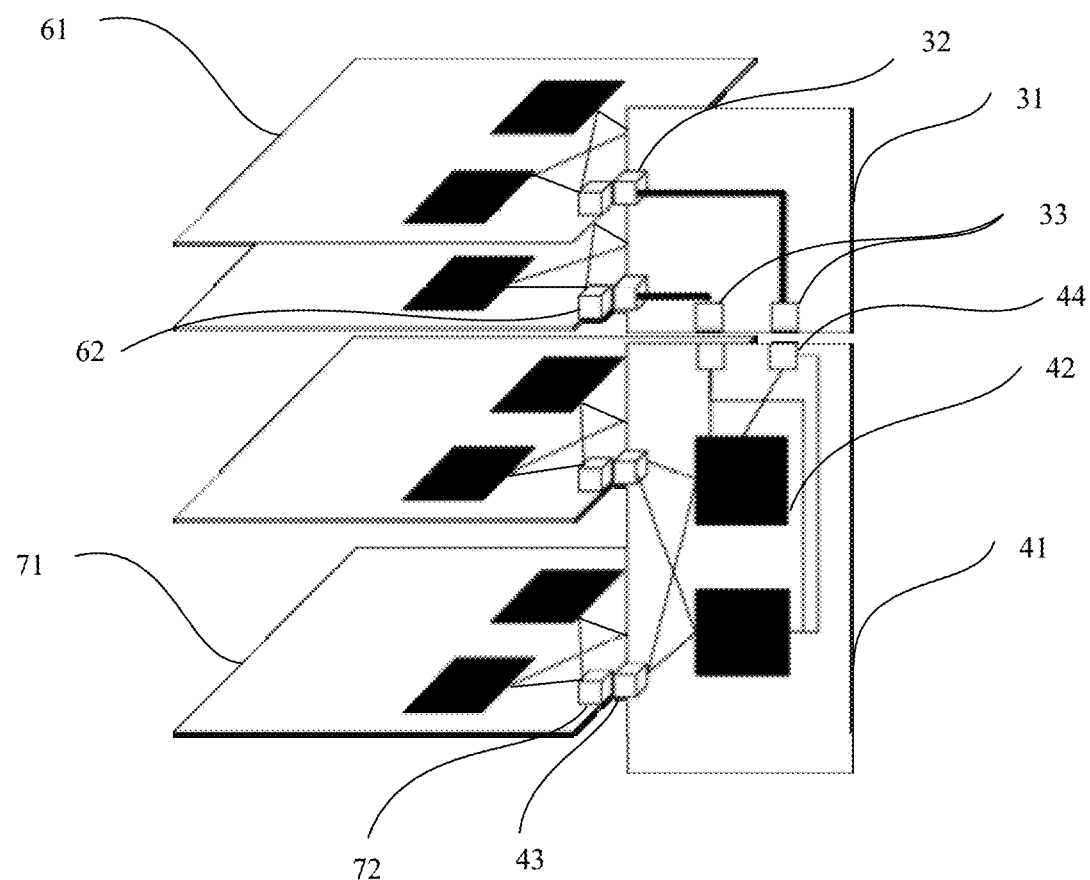
FIG. 5 is a schematic structural diagram of a communications device according to another embodiment of the present invention.

As shown in FIG. 5, the first line card includes a first line card body 61 and a fifth connector 62 disposed on a first line card side of the first line card body 61. The second line card includes a second line card body 71 and a sixth connector 72 disposed, on a second line card side of the second line card body 71. The connection apparatus is connected to the first line card by using the first connector 32 and the fifth connector 62. The first line card body 61 is perpendicular to the connection apparatus. The network board is connected to the second line card by using the third connector 43 and the sixth connector 72. The first line card body 61 is perpendicular to the network board body 41. The first line card side is roughly parallel to the second line card side.

A structure and a principle of the network board connection system included in the communications device in this embodiment of the present invention are the same as those in the embodiment shown in FIG. 3 or FIG. 4. Details are not described again.

Specifically, FIG. 5 is a schematic structural diagram of a communications device according to another embodiment of the present invention.

As shown in FIG. 5, the structure of the network board connection system is the same as the structure of the network board connection system shown in FIG. 3. Both the first line card and the second line card further include a line card chip, and a connector on each line card is connected to a line card chip on the line card. The first line card includes two line cards. A fifth connector 62 of each line card in the first line card is connected to a first connector 32 of a connection apparatus, and a first line card body 61 of each line card in the first line card is perpendicular to the connection apparatus. In other words, the first line card is orthogonally connected to the connection apparatus. A manner in which the second line card is orthogonally connected to a network board is shown in FIG. 5. The second line card includes two boards. A sixth connector 72 of each line card in the second line card is connected to a third connector 43 in the network board. A second line card body 71 of each line card in the second line card is perpendicular to a network board body 41. In other words, the second line card is orthogonally connected to the network board. A first line card side of each line card in the first line card and a second line card side of each line card in the second line card are roughly parallel to each other.

In this way, the connection apparatus expands a quantity of line cards connected to the network board, to improve a capacity of the communications device. The first line card and the second line card may be arranged in a same manner, and the line card, the connection apparatus, and the network board are properly arranged, to reduce space occupied when the line card, the connection apparatus and the network board are interconnected to each other, and reduce a size of the communications device.

Figure 6:
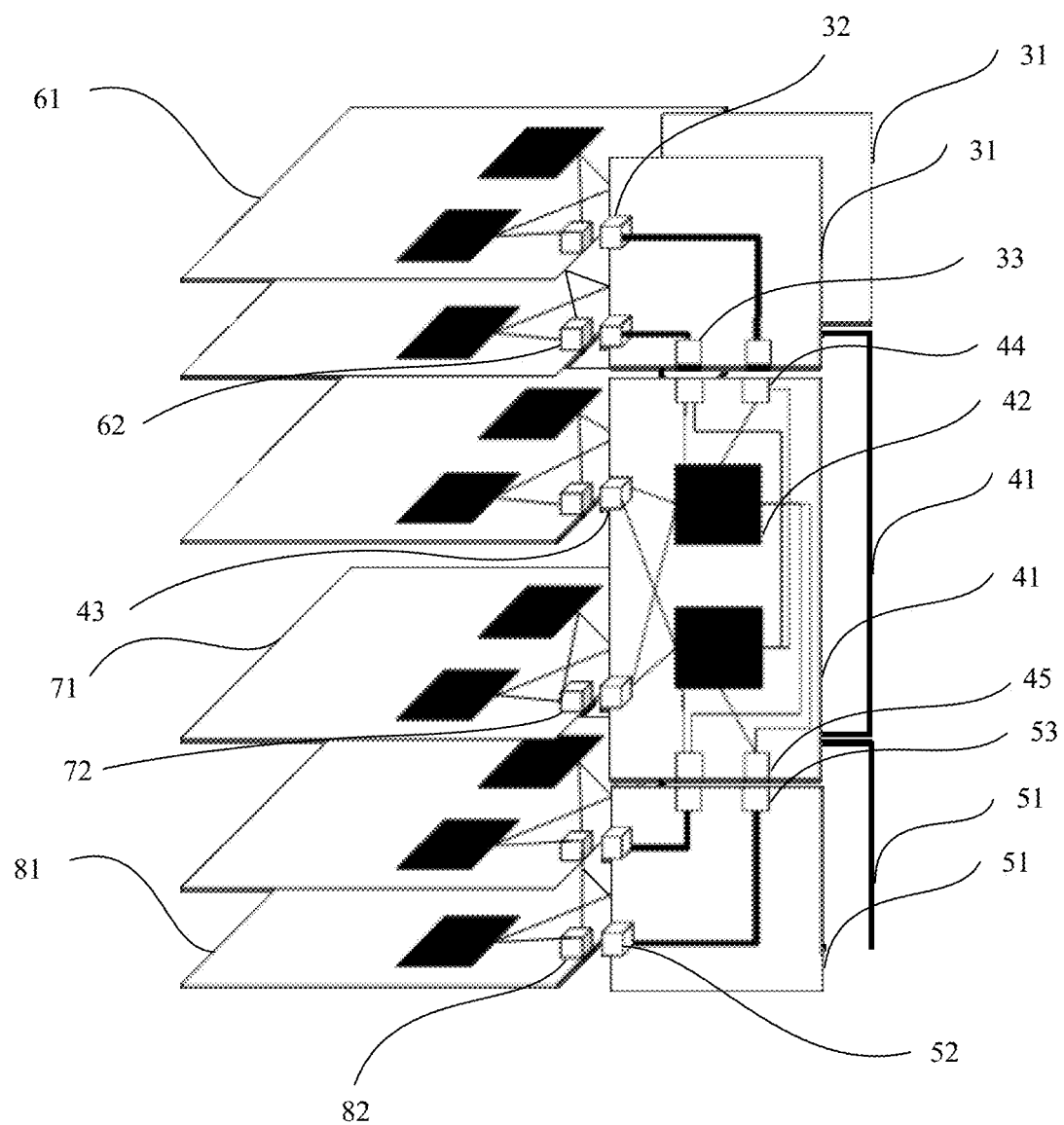
FIG. 6 is a schematic structural diagram of still another communications device according to another embodiment of the present invention.

Specifically, FIG. 6 is a schematic structural diagram of still another communications device according to another embodiment of the present invention. As shown in FIG. 6, a structure of a network board connection system is the same as the structure of the network board connection system shown in FIG. 4. The communications device includes two network boards. For ease of description, a network board located on a front side is referred to as a front side network board, and a network board located on a rear side is referred to as a rear side network board. Structures of two network boards are the same.

Figure 7:
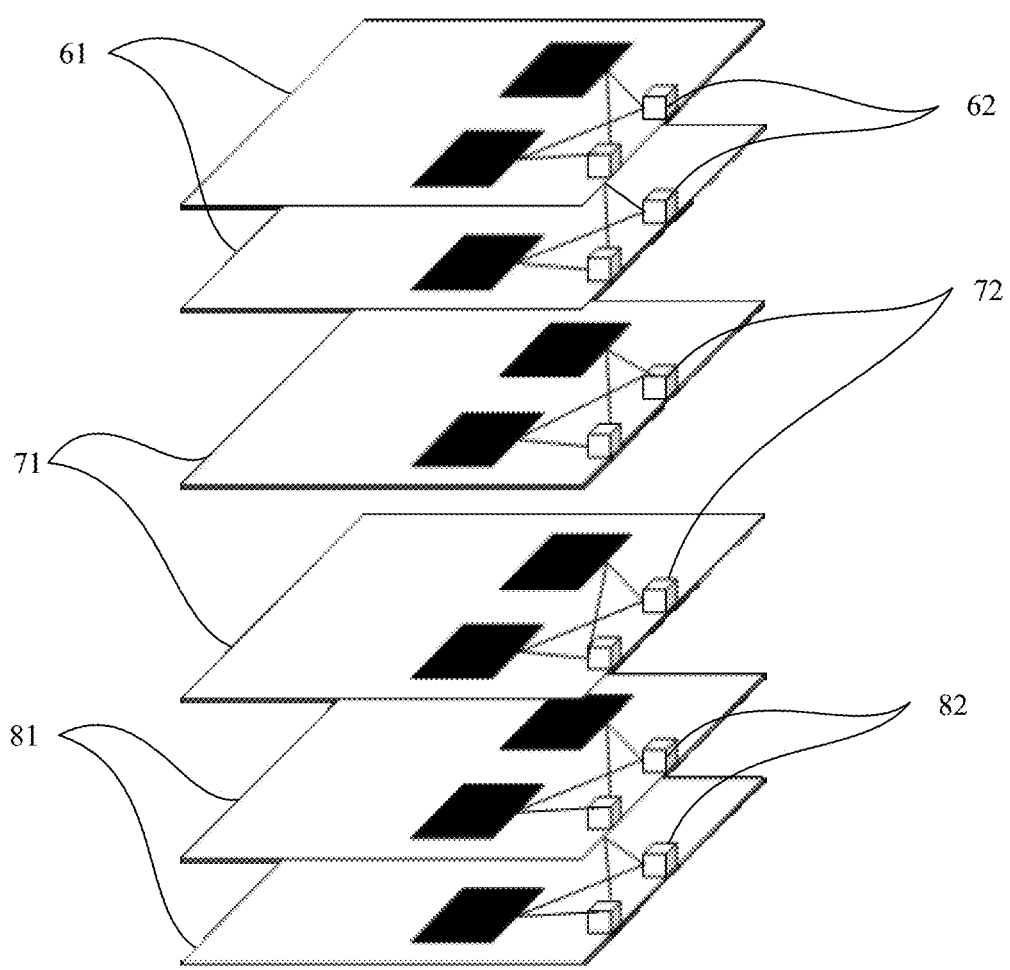
FIG. 7 is a schematic structural diagram of a line card according to another embodiment of the present invention.

The communications device further includes: a first connection apparatus located on an upper part of the front side network board and a second connection apparatus located on a lower part of the front side network board, a second line card connected to the front side network board, a first line card connected to the first connection apparatus, and a third line card connected to the second connection apparatus. FIG. 7 is a schematic structural diagram of a first line card, a second line card, and a third line card. The first line card includes a first line card body 61, a line card chip, and a fifth connector 62 connected to the line card chip. The second line card includes a second line card body 71, a line card chip, and a sixth connector 72 connected to the line card chip. The third line card includes a third line card body 81, a line card chip, and a fifth connector 82 connected to the line card chip. One connector in the connector of each line card is configured to be connected to the front side network board or a connection apparatus connected to the front side network board. Another connector is configured to be connected to the rear side network board or a connection apparatus connected to the rear side network board.

The first line card is connected to a first connection apparatus. To be specific, the fifth connector 62 located on a front side in the first line card is connected to a first connector 32 of the first connection apparatus connected to the front side network board, and the fifth connector 62 located on a rear side in the first line card is connected to the first connector 32 of the first connection apparatus connected to the rear side network board. During data transmission, the first line card is connected to a network board chip 42 by using the fifth connector 62, the first connector 32, a second connector 33, and a fourth connector 44, to exchange data with another line card.

The second line card is connected to the network board. To be specific, the sixth connector 72 located on a front side in the second line card is connected to a third connector 43 on the front side network board, and the sixth connector 72 located on a rear side in the second line card is connected to the third connector 43 on the rear side network board.

The third line card is connected to a second connection apparatus. To be specific, the fifth connector 82 located on a front side in the third line card is connected to a first connector 52 of the second connection apparatus connected to the front side network board, and the fifth connector 82 located on a rear side in the third line card is connected to the first connector 52 of the second connection apparatus connected to the rear side network board. During data transmission, the third line card is connected to the network board chip 42 by using the fifth connector 82, the first connector 52, the second connector 53 connection, and the fourth connector 45, to exchange data with another line card.

It should be noted that a manner and a principle for connection between the third line card and the second connection apparatus are the same as a manner and a principle for connection between the first line card and the first connection apparatus.

In this way, as shown in FIG. 6, the first connection apparatus and the second connection apparatus that are connected to each network board expand a quantity of network boards connected to the line card, improve a capacity of the communications device. The first line card, the second line card, and the third line card may be arranged in a same manner, and the line card, the connection apparatus, and the network board are properly arranged, to reduce space occupied when the line card, the connection apparatus and the network board are interconnected to each other, and reduce a size of the communications device.

The foregoing descriptions are merely specific implementations of the present invention, but are not intended to limit the protection scope of the present invention.

What is claimed is:

1. A network board connection system, comprising a network board and a connection apparatus, wherein
 the connection apparatus comprises:
 a housing case, wherein the housing case comprises a first side face and a second side face that are intersected and disposed adjacent to each other;
 a first connector, disposed on the first side face and configured to be connected to a connector of a first line card, so that the connection apparatus is orthogonally connected to the first line card; and
 a second connector, disposed on the second side face and connected to the first connector, wherein the second connector is configured to be connected to a connector of a network board;
 and wherein the network board comprises a network board body, a network board chip disposed on the network board body, a third connector, and a fourth connector;
 the third connector is disposed on a first network board side of the network board body and connected to the network board chip;
 the fourth connector is disposed on a side adjacent to the first network board side of the network board body and connected to the network board chip;
 the third connector is configured to be connected to a connector of a second line card, so that the network board is orthogonally connected to the second line card;
 the fourth connector is connected to the second connector of the connection apparatus, so that the connection apparatus is connected to the network board; and
 when the connection apparatus is connected to the network board, a connection interface of the first connector and a connection interface of the third connector face a same direction,
 wherein the second connector is movably connected to the second side face in a direction perpendicular to the second side face, to be disposed close to or away from the second side face, in order to connect and disconnect the second connector from the network board without moving the connection apparatus or the network board to reduce the plugging and unplugging forces the network board bears, and
 wherein the first connector and the third connector are configured to be aligned in a direction from the connection apparatus to the network board.

2. The network board connection system according to claim 1, wherein when the connection apparatus is connected to the network board, the first connector and the third connector are aligned in a direction from the connection apparatus to the network board.

3. A communications device, comprising a first line card, a second line card, and a network board connection system, wherein
 the network board connection system comprises a network board and a connection apparatus, wherein the connection apparatus comprises:
 a housing case, wherein the housing case comprises a first side face and a second side face that are intersected and disposed adjacent to each other;
 a first connector, disposed on the first side face and configured to be connected to a connector of the first line card, so that the connection apparatus is orthogonally connected to the first line card; and
 a second connector, disposed on the second side face and connected to the first connector, wherein the second connector is configured to be connected to a connector of a network board;
 and wherein the network board comprises a network board body, a network board chip disposed on the network board body, a third connector, and a fourth connector;
 the third connector is disposed on a first network board side of the network board body and connected to the network board chip;
 the fourth connector is disposed on a side adjacent to the first network board side of the network board body and connected to the network board chip;
 the third connector is configured to be connected to a connector of the second line card, so that the network board is orthogonally connected to the second line card;

the fourth connector is connected to the second connector of the connection apparatus, so that the connection apparatus is connected to the network board; and when the connection apparatus is connected to the network board, a connection interface of the first connector and a connection interface of the third connector face a same direction;

the first line card comprises a first line card body and a fifth connector disposed on a first line card body side of the first line card body;

the second line card comprises a second line card body and a sixth connector disposed on a second line card body side of the second line card body;

the connection apparatus is connected to the first line card by using the first connector and the fifth connector, and the first line card body is perpendicular to the connection apparatus;

the network board is connected to the second line card by using the third connector and the sixth connector, ande the second line card body is perpendicular to the network board body; and the first line card side and the second line card side are parallel to each other, wherein the second connector is movably connected to the second side face in a direction perpendicular to the second side face, to be disposed close to or away from the second side face, in order to connect and disconnect the second connector from the network board without moving the connection apparatus or the network board to reduce the plugging and unplugging forces the network board bears, and wherein the first connector and the third connector are configured to be aligned in a direction from the connection apparatus to the network board.

4. The communications device according to claim 3, wherein the first network board side is perpendicular to the second line card side.

* * * * *